United States Patent [19]

Fajt

[11] 4,124,846

[45] Nov. 7, 1978

[54] METHOD AND APPARATUS FOR PROVIDING OUTPUT INDICATIONS IN RESPONSE TO THE PRESENCE OF AN ELECTROMAGNETIC ENERGY RECEPTOR

[75] Inventor: John Fajt, Paoli, Okla.

[73] Assignee: ELT Incorporated, Northfield, Ill.

[21] Appl. No.: 689,175

[22] Filed: Jun. 2, 1976

Related U.S. Application Data

[63] Continuation-in-part of Ser. No. 681,404, Apr. 29, 1976.

[51] Int. Cl.² ............... G01D 21/04; G08B 13/26; G01R 27/26
[52] U.S. Cl. ................... 340/540; 315/176; 324/61 R; 324/122; 340/562
[58] Field of Search ............ 324/122, 133, 95, 61 R; 340/258 C, 258 B; 250/374; 200/DIG. 1; 315/176, 349

[56] References Cited

U.S. PATENT DOCUMENTS

| 2,525,768 | 10/1950 | Bruns | 324/122 |
| 2,925,539 | 2/1960 | Jellinek | 200/DIG. 1 |

OTHER PUBLICATIONS

Gottlieb, I.; "The RF Sniffer"; "CQ" — The Radio Amateur's Journal; Mar. 1951; p. 33.

*Primary Examiner*—Rudolph V. Rolinec
*Assistant Examiner*—Ernest F. Karlsen
*Attorney, Agent, or Firm*—Dunlap, Codding & McCarthy

[57] ABSTRACT

A method and apparatus for providing output indications in response to the presence of an electromagnetic energy receptor within a predetermined distance of a glow discharge device the electrodes of which have a voltage applied thereacross at least equal to the maintaining voltage but less than the breakdown voltage, including an excitor for generating an electromagnetic field around the glow discharge device at a strength less than the ionization level but sufficient to ionize the gas when the electromagnetic energy receptor is within the predetermined distance of the glow discharge device.

7 Claims, 4 Drawing Figures

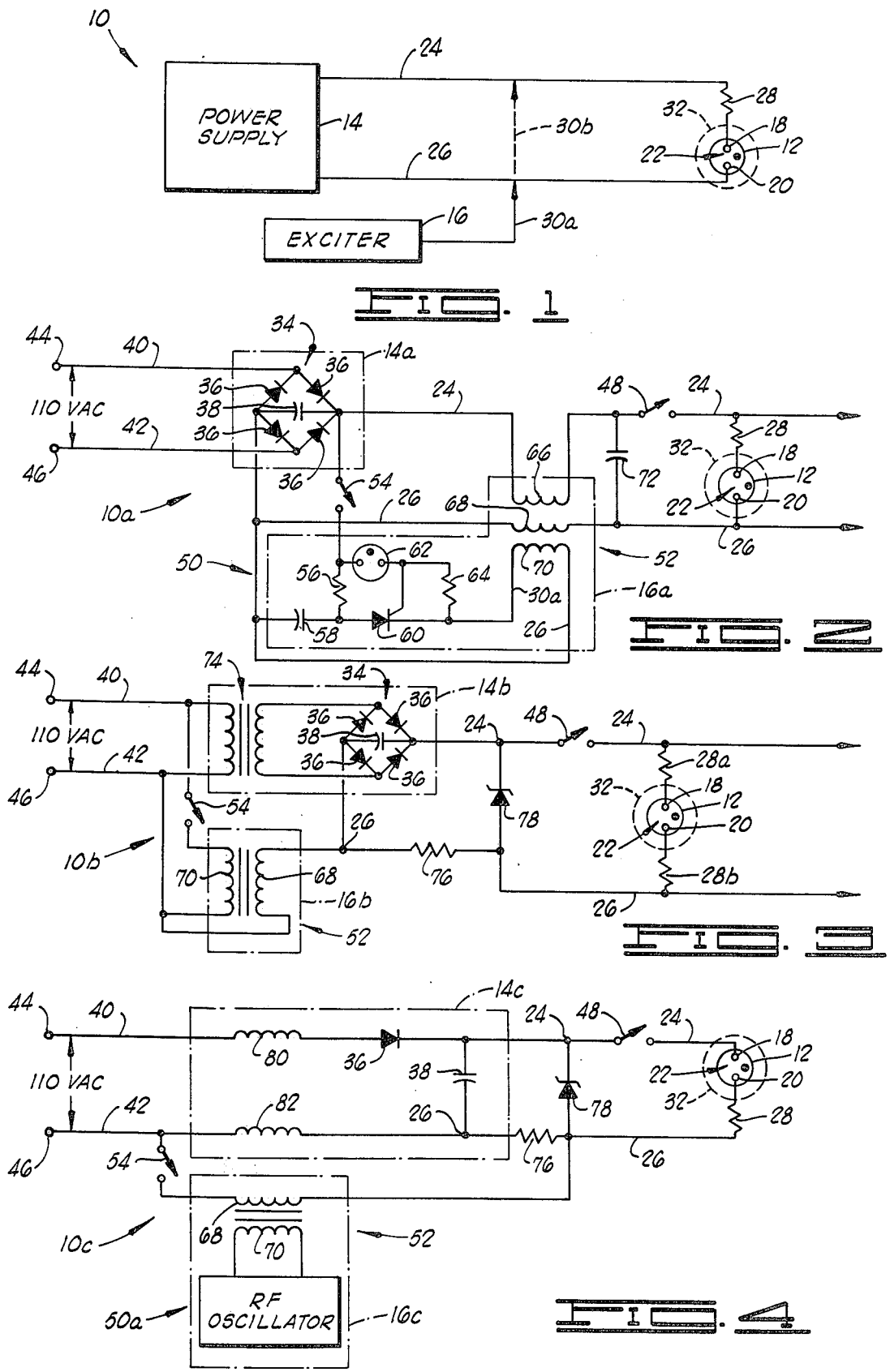

METHOD AND APPARATUS FOR PROVIDING OUTPUT INDICATIONS IN RESPONSE TO THE PRESENCE OF AN ELECTROMAGNETIC ENERGY RECEPTOR

CROSS-REFERENCE TO RELATED APPLICATIONS

This patent application is a continuation-in-part of the applicant's application entitled "Method and Apparatus for Providing Output Indications in Response to the Presence of an Electromagnetic Energy Receptor", filed Apr. 29, 1976, Ser. No. 681,404.

BACKGROUND OF THE INVENTION

1. Field of the Invention

This invention relates generally to a method and apparatus for providing output indications in response to the presence of an electromagnetic energy receptor and, more particularly, but not by way of limitation, to a method and apparatus for providing output indications in response to the presence of an electromagnetic energy receptor within a predetermined distance of a glow discharge device.

2. Description of the Prior Art

In the past, glow discharge devices have been used for a variety of applications, many such applications being described and illustrated in *Using and Understanding Miniature Neon Lamps,* William G. Miller, Howard W. Sams and Company, Inc., Indianapolis, Indiana. Although such glow discharge devices have been utilized in capacitive sensing circuits such as that described on page 74 of the above referenced publication, it is believed that the present invention represents the first time that such glow discharge devices are being utilized to provide an output indication in response to the mere presence of an electromagnetic energy receptor within a predetermined distance of the glow discharge device.

SUMMARY OF THE INVENTION

A method and apparatus for providing output indications in response to the presence of an electromagnetic energy receptor within a predetermined distance of a glow discharge device the electrodes of which have a voltage applied thereacross at least equal to the maintaining voltage but less than the breakdown voltage, including an exciter for generating an electromagnetic field around the glow discharge device at a strength less than the ionization level but sufficient to ionize the gas when the electromagnetic energy receptor is within the predetermined distance of the glow discharge device.

It is an object of the present invention to provide a method for providing an output indication in response to the presence of an electromagnetic energy receptor.

Another object is to provide an apparatus for providing an output indication in response to the presence of an electromagnetic energy receptor.

A further object of the invention is to provide an apparatus for providing an output indication in response to the presence of an electromagnetic energy receptor within a predetermined distance of a glow discharge device, the apparatus being simple and economical in construction and operation.

Other objects and advantages of the present invention will be evident from the following detailed description when read in conjunction with the accompanying drawings which illustrate various embodiments of the invention.

BRIEF DESCRIPTION OF THE DRAWINGS

FIG. 1 illustrates in diagrammatic form an apparaus for providing an output indication in response to the presence of an electromagnetic energy receptor constructed in accordance with the preferred embodiment of the present invention.

FIG. 2 illustrates in schematic form a preferred embodiment of the apparatus shown in FIG. 1.

FIG. 3 illustrates in schematic form an alternate embodiment of the apparatus shown in FIG. 1.

FIG. 4 illustrates in schematic form still another embodiment of the apparatus shown in FIG. 1.

DESCRIPTION OF THE PREFERRED EMBODIMENT

Referring to the figures in general and to FIG. 1 in particular, shown therein and referred to by the general reference number 10 is an apparatus for providing an output indication in response to the presence of an electromagnetic energy receptor. For convenience of reference, the apparatus shown in FIG. 1 will be hereinafter referred to simply as the proximity sensor 10.

The proximity sensor 10 is comprised generally of a glow discharge device such as the cold cathode diode 12, a power supply 14, and an exciter 16. The cold cathode diode 12 has a pair of electrodes 18 and 20, and an inert gas, indicated generally by the reference number 22, disposed generally between the electrodes 18 and 20. The gas 22, which may be selected from a group consisting of neon, helium argon, xenon and kyrpton, operates in a conventional manner to allow current to flow through the cold cathode diode 12 generally between the electrodes 18 and 20 when the gas 22 is in an ionized state. As will be clear to those skilled in the art, the gas 22 will be ionzied when a voltage applied across the electrodes 18 and 20 is at least equal to a predetermined breakdown voltage, the level of which is determined mainly by the type of gas, electrode spacing, gas pressure, and external ionizing forces, such as light. As will be also clear to those skilled in the art, the gas 22 will also be ionized when in the presence of an electromagnetic field having a strength at least equal to a predetermined ionization level, the level of which is determined mainly by the type of gas and other external ionizing forces. It will also be clear to those skilled in the art that the gas 22 will remain in the ionized state so long as the voltage applied across the electrodes 18 and 20 is at least equal to a predetermined maintaining voltage, the level of which is determined by substantially the same factors as those influencing breakdown voltage.

The power supply 14 is connected to the cold cathode diode 12, with a signal path 24 being connected to the electrode 18 and a signal path 26 being connected to the electrode 20. The power supply 14 operates in a conventional manner to apply a voltage across the electrodes 18 and 20 at least equal to the maintaining voltage but less than the breakdown voltage. In the preferred embodiment, a current limiting resistor 28 is interposed generally between the power supply 14 and one of the electrodes 18 and 20 of the cold cathode diode 12, such as in the signal path 24 as shown in FIG. 1, to prevent destructive current flow through the cold cathode diode 12.

The exciter 16, which is shown in FIG. 1 as being generally connected to the cold cathode diode 12 via the general signal path 30a and if desired the signal path 30b, operates to generate an electromagnetic field around the cold cathode diode 12 at a strength less than the ionization level but sufficient to ionize the gas 22 when an electromagnetic receptor (not shown) is within the predetermined distance of the cold cathode diode 12, indicated generally by the phantom line referred to by the reference number 32. For the purposes of this description, the electromagnetic energy receptor may be defined as any body having a sufficiently large mass. For example, a human body operates as an efficient electromagnetic energy receptor in the presence of an electromagnetic field having a strength on the order contemplated by the present invention.

It has been determined that the exciter can efficiently generate the desired electromagnetic field around the cold cathode diode 12 by operating as a pulse generator to provide output pulses having predetermined amplitude on the order of 1500 volts to 10K volts. The output pulses provided by the exciter 16 may then be applied to the electrodes 18 and 20 in a conventional manner such as inductive coupling.

It has also been determined that the output pulses provided by the exciter are most effective in generating the electromagnetic radiation when the pulses are of a predetermined duration on the order of 25 μsec to 20 msec. As will be clear to those skilled in the art, such output pulses may be produced either in an intermittent manner as a relatively high amplitude spike or in a sinusoidal manner at a predetermined frequency on the order to 100 Hz to 450 KHz.

Operation of the Preferred Embodiment

In operation, the power supply 14 will operate to apply a voltage across the electrodes 18 and 20 which is less than the breakdown voltage but at least equal to the maintaining voltage. The exciter 16 will operate to generate the electromagnetic field around the cold cathode diode 12, as indicated generally by the reference number 32, by applying a pulsed signal to the electrodes 18 and 20. So long as the strength of the electromagnetic field produced via the electrodes 18 and 20 is maintained below the ionization level, no current will flow through the cold cathode diode 12. However, if the electromagnetic field is maintained at a strength sufficiently near the ionization level, the presence of the electromagnetic energy receptor within the predetermined distance (indicated by the reference number 32) will be sufficient to ionize the gas 22 and allow current flow through the cold cathode diode 12. The current flow through the cold cathode diode 12 provides both an electrically and visually perceivable output indication in response to the presence of the electromagnetic energy receptor within the predetermined distance 32.

Although the exact mechanism by which the electromagnetic energy receptor makes its presence felt within the predetermined distance 32 of the cold cathode diode 12 to ionize the gas 22 is not fully understood at this time, it has been determined that the shape defined by the predetermined distance 32 is highly dependent on the shape and relative spacing of the electrodes 18 and 20. In addition, it has been determined that the size of the predetermined distance 32, and thus the "sensitivity" of the proximity sensor 10, may be varied as a function of the amplitude, duration, and frequency of the pulses applied to the cold cathode diode 12 by the exciter 16, and the DC voltage applied across the electrodes 18 and 20. Thus, the ranges described above for the amplitude, duration and frequency of the output pulses are given by way of example only and are not intended to be limiting in any manner.

DESCRIPTION OF FIG. 2

Shown in FIG. 2 is a proximity sensor 10a representing a preferred embodiment of the proximity sensor 10 shown in FIG. 1 and described generally above. The proximity sensor 10a is comprised generally of the cold cathode diode 12, a power supply 14a, and an exciter 16a. The cold cathode diode 12 is constructed substantially the same as the cold cathode diode 12 shown in FIG. 1 and described generally above.

The power supply 14a is comprised of a bridge rectifier 34 formed from four diodes 36, and a smoothing capacitor 38. The AC input terminals of the bridge rectifier 34 are connected to a conventional power source (not shown) supplying 110 volts AC via signal paths 40 and 42, and the terminals 44 and 46, respectively. The positive DC output terminal of the bridge rectifier 34 is connected to the signal path 24 and the negative DC output terminal is connected to the signal path 26. The capacitor 38 is connected between the DC output terminals of the bridge rectifier 34. As will be clear to those skilled in the art, the power supply 14a operates to provide a relative positive operating potential via the signal path 24 and a relative ground potential via the signal path 26. The electrode 18 is connected to the positive operating potential provided by the power supply 14a via the signal path 24, a switch 48, and a current limiting resistor 28, while the electrode 20 is connected to the relative ground potential via the signal path 26. As indicated by the arrows on the ends of the signal paths 24 and 26, additional cold cathode diodes 12 or other electrodes of a multi-electrode glow discharge device may be interposed between the signal paths 24 and 26 with associated current limiting resistors 28, each such additional glow discharge device operating substantially the same as the cold cathode diode 12 shown in FIG. 2.

The exciter 16a is comprised generally of a pulse generator 50 and a pulse coupling transformer 52. The pulse generator 50 is comprised of a switch 54, a resistor 56, and a capacitor 58 connected in series between the positive operating potential on the signal path 24 and the relative ground potential on the signal path 26; an SCR 60, the anode of which is connected to the junction between the resistor 56 and capacitor 58 and the cathode of which is connected to the transformer 52 via a signal path 30a; a cold cathode diode 62, the electrodes of which are connected between the junction between the switch 54 and the resistor 56, and the gate of the SCR 60; and a resistor 64 connected between the gate and cathode of the SCR 60.

When the switch 54 is closed, the pulse generator 50 operates to charge the capacitor 58 via the resistor 56 until the potential between the electrodes of the cold cathode diode 62 exceeds the breakdown voltage of the gas disposed therein, thereby allowing the capacitor 58 to begin discharging through the cold cathode diode 62, the resistor 64 and the transformer 52. The initial flow of current through the glow lamp 62 provides a pulse of current to the gate of the SCR 60 thereby turning on the SCR 60 and allowing the capacitor 58 to rapidly dump its charge through the SCR 60 and the transformer 52. After the capacitor 58 has discharged to the level at which the potential between the electrodes of the cold cathode diode 62 is less than the maintaining voltage of the gas disposed therein, the cold cathode diode 62 will cease to conduct current. However, the SCR 60 will not turn off until the capacitor 58 has substantially fully discharged. Thereafter, the capacitor 58 will recharge via the switch 54 and the resistor 56. Thus the pulse generator 50 will provide output pulses for application to the transformer 52 at an amplitude and frequency determined in a conventional manner by the relative component values of the resistor 56, the capacitor 58, the cold cathode diode 62, and the impedance of the transformer 52.

The transformer 52 is comprised of a first coil 66 interposed in the signal path 24 between the power supply 14a and the switch 48, a second coil 68 interposed in the signal path 26 between the power supply 14a and the electrode 20, and a third coil 70 interposed between the cathode of the SCR 60 and the signal path 26. More particularly, the coil 70 forms the primary winding of the transformer 52 and the coils 66 and 68 form the secondary windings thereof. The coils 66 and 68 are constructed in a substantially identical manner, including being wound in the same direction. As will be clear to those skilled in the art, the transformer 52 operates to inductively couple the pulse generator 50 output signals to the electrodes 18 and 20, since the primary winding thereof is connected to the pulse generator 50 and the secondary windings thereof are connected between the power supply 14a and the electrodes 18 and 20. In addition to inductively coupling the pulse generator 50 output pulses to the electrodes 18 and 20, the coils 66 and 68 each operate as a conventional choke to isolate the pulse generator 50 output pulses from the power supply 14a.

In the preferred embodiment, the transformer 52 is constructed to operate as a step-up transformer by having more than one turn in the coils 66 and 68 for each turn in the coil 70. A coupling capacitor 72 is connected between the junction between the coil 66 and the switch 48, and the junction between the coil 68 and the electrode 20 to equalize the amplitude of the pulses applied to the electrodes 18 and 20 via the transformer 52.

Description of FIG. 3

Shown in FIG. 3 is a proximity sensor 10b representing an alternate embodiment of the proximity sensor 10 shown in FIG. 1 and described generally above. The proximity sensor 10b is comprised generally of a cold cathode diode 12, a power supply 14b, and an exciter 16b. The cold cathode diode 12 is constructed substantially the same as the cold cathode diode 12 shown in FIG. 1 and described generally above.

The power supply 14b is constructed substantially the same as the power supply 14a shown in FIG. 2 and described generally above, except that the power supply 14b includes an isolation transformer 74, the primary winding of which is in series with the power source (not shown) via the signal paths 40 and 42, and the secondary winding of which is in series with the AC input terminals of the bridge rectifier 34. As will be clear to those skilled in the art, the isolation transformer 74 operates to isolate the pulses provided by the exciter 16b from the power source (not shown).

The electrode 18 is connected to the positive operating potential provided by the power supply 14b via the signal path 24, a switch 48, and a current limiting resistor 28a, while the electrode 20 is connected to the relative ground potential via the signal path 26. A second current limiting resistor 28b is included in the signal path 26 between the power supply 14b and the electrode 20, illustrating that the current limiting function may be performed by current limiting resistors, such as the current limiting resistors 28a and 28b, interposed in either one or both of the signal paths 24 and 26 generally between the power supply 14b and the electrodes 18 and 20 of the cold cathode diode 12.

The exciter 16b is comprised of a switch 54 and a pulse coupling transformer 52. As will be clear to those skilled in the art, the exciter 16b substantially substitutes the power source (not shown) connected to the terminals 44 and 46 for the pulse generator 50 of the exciter 16a by utilizing the AC component of the 110 volt AC signal in place of the output pulses provided by the pulse generator 50. In other words, when the switch 54 is closed, the power source (not shown) will provide output pulses for application to the transformer 52 at an amplitude of 110 volts and a frequency of 60 Hz.

The transformer 52 is comprised of a primary coil or winding 70 interposed between the signal path 42 and the switch 54, and a secondary coil or winding 68 interposed between the signal paths 42 and 26. As will be clear to those skilled in the art, the transformer 52 operates to inductively couple the 110 volt AC signal to the electrodes 18 and 20. If desired, a resistor 76 may be interposed in the signal path 26, together with a zener diode 78, the anode of which is connected to the signal path 26 generally between the resistor 76 and the resistor 28b, and the cathode of which is connected to the signal path 24, to clamp the positive operating potential on the signal path 24 at a predetermined amplitude relative to the ground potential on the signal path 26.

Description of FIG. 4

Shown in FIG. 4 is a proximity sensor 10c representing still another embodiment of the proximity sensor 10 as shown in FIG. 1 and described generally above. The proximity sensor 10c is comprised generally of the cold cathode diode 12, a power supply 14c and an exciter 16c. The cold cathode diode 12 is constructed substantially the same as the cold cathode diode 12 shown in FIG. 1 and described generally above.

The power supply 14c is comprised of a pair of chokes 80 and 82, a diode 36, and a smoothing capacitor 38. The anode of the diode 36 and one side of the capacitor 38 are connected to a conventional power source (not shown) supplying 110 volts AC via the signal paths 40 and 42, and the terminals 44 and 46, respectively. The other side of the capacitor 38 is connected to the cathode of the diode 36 via the signal path 24. The choke 80 is interposed in the signal path 40 generally between the terminal 44 and the anode of the diode 36, while the choke 82 is interposed in the signal path 42 generally between the terminal 46 and the capacitor 38. As will be clear to those skilled in the art, the diode 36 operates as a half wave rectifier, the output of which is smoothed by the capacitor 38, so that the power supply 14c operates to provide a relative positive operating potential via the signal path 24 and a relative ground potential via the signal path 26. The chokes 80 and 82 operate in a conventional manner to isolate the proximity sensor 10c.

The electrode 18 is connected to the positive operating potential provided by the power supply 14c via the signal path 24 and a switch 48, while the electrode 20 is connected to the relative ground potential via the signal path 26 and a current limiting resistor 28.

The exciter 16c is comprised generally of a switch 54, an RF oscillator 50a, and a pulse coupling transformer 52. The RF oscillator 50a, which is constructed in a conventional manner operates to apply output pulses to the transformer 52 at a relatively high frequency on the order of 100 KHz to 1 MHz.

The transformer 52 is comprised of a primary coil or winding 70 connected to the RF oscillator 50a, and a secondary coil or winding 68 interposed between the switch 54 and signal path 26. As will be clear to those skilled in the art, the transformer 52 operates to inductively couple the RF signal provided by the RF oscillator 50a to the electrodes 18 and 20 when the switch 54 is closed. If desired, a resistor 76 may be interposed in the signal path 26, together with a zener diode 78, the anode of which is connected to the signal path 26 generally between the resistor 76 and the resistor 28, and the cathode of which is connected to the signal path 24, to clamp the positive operating potential on the signal path 24 at a predetermined amplitude relative to the ground potential on the signal path 26.

Although the invention has been described herein as being specifically applicable to glow discharge devices of the cold cathode diode type, it is to be understood that the invention is equally applicable to other, multi-electrode glow discharge devices well known in the art. Changes may be made in the construction and the arrangement of the parts or the elements of the various embodiments as disclosed herein without departing from the spirit and the scope of the invention as defined in the following claims.

What is claimed is:

1. Proximity sensing apparatus comprising:
   a glow discharge device having a pair of electrodes and an inert gas disposed between the electrodes, the gas allowing current to flow through the glow discharge device when the gas is in an ionized state, the gas being ionized when a voltage applied across the electrodes is at least equal to a predetermined breakdown voltage, and remaining in the ionized state so long as the voltage applied across the electrodes is at least equal to a predetermined maintaining voltage;
   a power supply connected to the glow discharge device, the power supply applying a voltage across the electrodes at least equal to the maintaining voltage but less than the breakdown voltage; and
   pulse generating means for applying a pulsed signal to each of said electrodes, said pulsed signal having a predetermined frequency from at least about 60 Hz and an amplitude from at least about 1500 volts selected to induce ionization of the inert gas in the glow discharge device when a mass is located within a predetermined positive distance of the glow discharge device, whereby current flow through the glow discharge device provides an output indication in response to the presence of the mass within the predetermined distance.

2. The apparatus of claim 1 wherein the predetermined frequency is further characterized as being from at least about 60 Hz to about 1 MHz.

3. The apparatus of claim 1 wherein the predetermined amplitude is further characterized as being from at least about 1500 volts to about 10 K volts.

4. The apparatus of claim 1 further defined to include:
   a current limiting resistor interposed between the power supply and one of the electrodes.

5. A method for providing an output indication in response to the presence of a mass within a predetermined distance of a glow discharge device having a pair of electrodes and an inert gas disposed between the electrodes, the method comprising the steps of:
   applying a voltage across the electrodes less than a predetermined breakdown voltage at which the gas will ionize to allow current flow through the glow discharge device, but at least equal to a predetermined maintaining voltage at which the gas will remain ionized; and,
   applying a pulsed signal to each of the electrodes, said pulsed signal having a pedetermined frequency from at least about 60 Hz and an amplitude from at least about 1500 volts selected to induce ionization of the gas in the glow discharge device when the mass is located within the predetermined distance of the glow discharge device, whereby current flow through the glow discharge device provides an output indication in response to the presence of the mass within the predetermined distance.

6. The method of claim 5 wherein the glow discharge device is further characterized as a cold cathode diode.

7. A method for providing an output indication in response to the presence of a mass within a predetermined distance of any one of a plurality of cold cathode diodes, each cold cathode diode having only a pair of electrodes and an inert gas disposed between the electrodes, the method comprising the steps of:
   applying a voltage across the electrodes of each of the cold cathode diodes, the voltage being less than a predetermined breakdown voltage at which the gas disposed in each of the cold cathode diodes will ionize to allow current flow through the respective cold cathode diode, but at least equal to a predetermined maintaining voltage at which the gas will remain ionized; and
   applying a pulsed signal to each of the electrodes of each of the cold cathode diodes, the pulsed signal having a predetermined frequency from at least about 60 Hz and an amplitude from at least about 1500 volts selected to induce ionization of the gas in a respective one of the cold cathode diodes when the mass is located within the predetermined distance of the respective cold cathode diode, whereby current flow through the respective cold cathode diode provides an output indication in response to the presence of the mass within the predetermined distance of the respective cold cathod diode.

* * * * *